US011637446B2

(12) United States Patent
Khodaei et al.

(10) Patent No.: US 11,637,446 B2
(45) Date of Patent: Apr. 25, 2023

(54) METHODS AND SYSTEMS FOR DETERMINING A LINEAR POWER FLOW FOR A DISTRIBUTION NETWORK

(71) Applicants: Commonwealth Edison Company, Chicago, IL (US); University of Denver, Denver, CO (US)

(72) Inventors: Amin Khodaei, Denver, CO (US); Shay Bahramirad, Oakbrook Terrace, IL (US); Aleksi Paaso, Oakbrook Terrace, IL (US)

(73) Assignees: Commonwealth Edison Company, Chicago, IL (US); University of Denver, Denver, CO (US)

( * ) Notice: Subject to any disclaimer, the term of this patent is extended or adjusted under 35 U.S.C. 154(b) by 374 days.

(21) Appl. No.: 16/569,324

(22) Filed: Sep. 12, 2019

(65) Prior Publication Data
US 2020/0091767 A1    Mar. 19, 2020

Related U.S. Application Data

(60) Provisional application No. 62/731,521, filed on Sep. 14, 2018.

(51) Int. Cl.
*H02J 13/00* (2006.01)
*G05B 15/02* (2006.01)
*G01R 19/00* (2006.01)
*G01R 25/00* (2006.01)
*G01R 19/25* (2006.01)

(52) U.S. Cl.
CPC ...... *H02J 13/0017* (2013.01); *G01R 19/0038* (2013.01); *G01R 19/2513* (2013.01); *G01R 25/005* (2013.01); *G05B 15/02* (2013.01)

(58) Field of Classification Search
CPC .... H02J 13/0017; H02J 3/00; H02J 13/00002; H02J 2203/10; G01R 19/0038; G01R 19/2513; G01R 25/005; G05B 15/02; Y02E 60/00; Y04S 10/30; Y04S 20/00; Y02B 90/20
See application file for complete search history.

(56) References Cited

U.S. PATENT DOCUMENTS

| | | | | |
|---|---|---|---|---|
| 2013/0151177 A1* | 6/2013 | Hughes | ............ | G06Q 10/063 702/60 |
| 2013/0229735 A1* | 9/2013 | Rostron | ............ | G01R 31/08 702/58 |
| 2015/0168465 A1* | 6/2015 | Gadiraju | ............ | G01R 21/003 702/60 |
| 2016/0072270 A1* | 3/2016 | Rostron | ............ | G05B 15/02 700/294 |
| 2018/0143237 A1* | 5/2018 | Beaudet | ............ | G01R 31/42 |

* cited by examiner

*Primary Examiner* — Ziaul Karim
(74) *Attorney, Agent, or Firm* — Ballard Spahr LLP

(57) ABSTRACT

Methods and systems are disclosed for determining active and/or reactive power flows in a distribution line of a distribution network. The determined power flows may be linear in nature, and they may further be used to determine an overall network power flow for the distribution network. Further, the network power flow can be used to determine a voltage magnitude for any distribution bus in the distribution network. The methods and systems are capable of considering a plurality of sensitivity factors that may affect one or more distribution buses.

20 Claims, 7 Drawing Sheets

FIG. 3

| Metric | Method | | Error% | MAPE |
|---|---|---|---|---|
| | Proposed | Sweep | | |
| Voltage magnitude (pu) | 0.914 | 0.913 | 0.11 | 0.03 |
| Active line flow (kW) | 514.31 | 520.00 | -1.09 | 0.35 |
| Reactive line flow (kVAR) | 243.42 | 240.00 | 1.42 | 0.59 |

300

| Metric | Step | | | |
|---|---|---|---|---|
| | 1 | 2 | 3 | 4 |
| Voltage magnitude (pu) | 0.919 | 0.914 | 0.913 | 0.913 |
| Active line flow (kW) | 510.00 | 514.31 | 514.70 | 514.73 |
| Reactive line flow (kVAR) | 240.00 | 243.42 | 243.73 | 243.75 |
| Network loss (kW) | 0 | 182.20 | 194.87 | 195.80 |

METHODS AND SYSTEMS FOR DETERMINING A LINEAR POWER FLOW FOR A DISTRIBUTION NETWORK

CROSS REFERENCE TO RELATED PATENT APPLICATION

This application claims priority to U.S. Provisional Application No. 62/731,521, filed on Sep. 14, 2018, which is herein incorporated by reference in its entirety.

BACKGROUND

A power flow is a numerical analysis of electricity flowing in a distribution line of a distribution network under a steady-state operation. By accounting for power injections (e.g., power generation), power withdrawal (e.g., electrical loads), and a topology of the distribution network (e.g., placement of feeders and distribution buses), a power flow analysis can determine active and reactive power flows in a distribution line. Further, the active and reactive power flows can be used to determine voltage magnitudes and angles for all distribution buses within the distribution network. Information provided by power flow analyses is significant and allows for improved planning, maintenance, operation, and control of distribution networks and associated power systems. Given the importance and complexity in determining an accurate power flow, various methodologies exist in the art. A primary focus of these methodologies has been developing computationally-efficient calculations with high accuracy and precision.

Existing methods require high levels of computational effort and weak convergence ability. These methods are fundamentally constructed based on well-conditioned transmission networks that are meshed and have low R/X ratios. The high voltage level and low R/X ratio inherent in transmission networks make these methods susceptible to ignoring power losses (e.g., active or reactive power flow losses) in smaller feeders in comparison with the large amount of power generation and consumption in a transmission network. This leads to an oversimplification of the power flow analysis, which therefore makes it necessary to develop power flow analysis methods tailored to distribution networks. These and other shortcomings are addressed by the methods and systems described herein.

SUMMARY

It is to be understood that both the following general description and the following detailed description are exemplary and explanatory only and are not restrictive. Methods and systems are described herein for determining active and reactive linear power flows in one or more distribution lines of a distribution network. The determined linear power flows can be used to develop an efficient model for directly determining voltage magnitudes and angles for any distribution bus in the distribution network. Unlike exiting power flow models for distribution networks, which are based on iterative methods and focus on load impedance models, the linear power flow model described herein considers real and reactive loads and does not require extensive iterative corrections when performing a power flow analysis.

The methods and systems described herein utilize voltage data, indicative of voltage magnitudes and voltage angles for a point of interest and one or more buses in a distribution network, to determine active and reactive power flows in a distribution line connecting a first and a second bus in the distribution network. The power flows are then used to generate an overall network power flow for the distribution network as well as a plurality of sensitivity factors for each distribution bus. The network power flow can be generated using the disclosed methods and systems in less time as compared to existing methods. Moreover, the generation of the network power flow using the present methods and systems requires less computational resources while maintaining accuracy as compared to existing methods.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 3 is a table depicting results from tests of the present methods and systems;
FIG. 4 is a table depicting further results from tests of the present methods and systems.

DETAILED DESCRIPTION

Figure 1A:
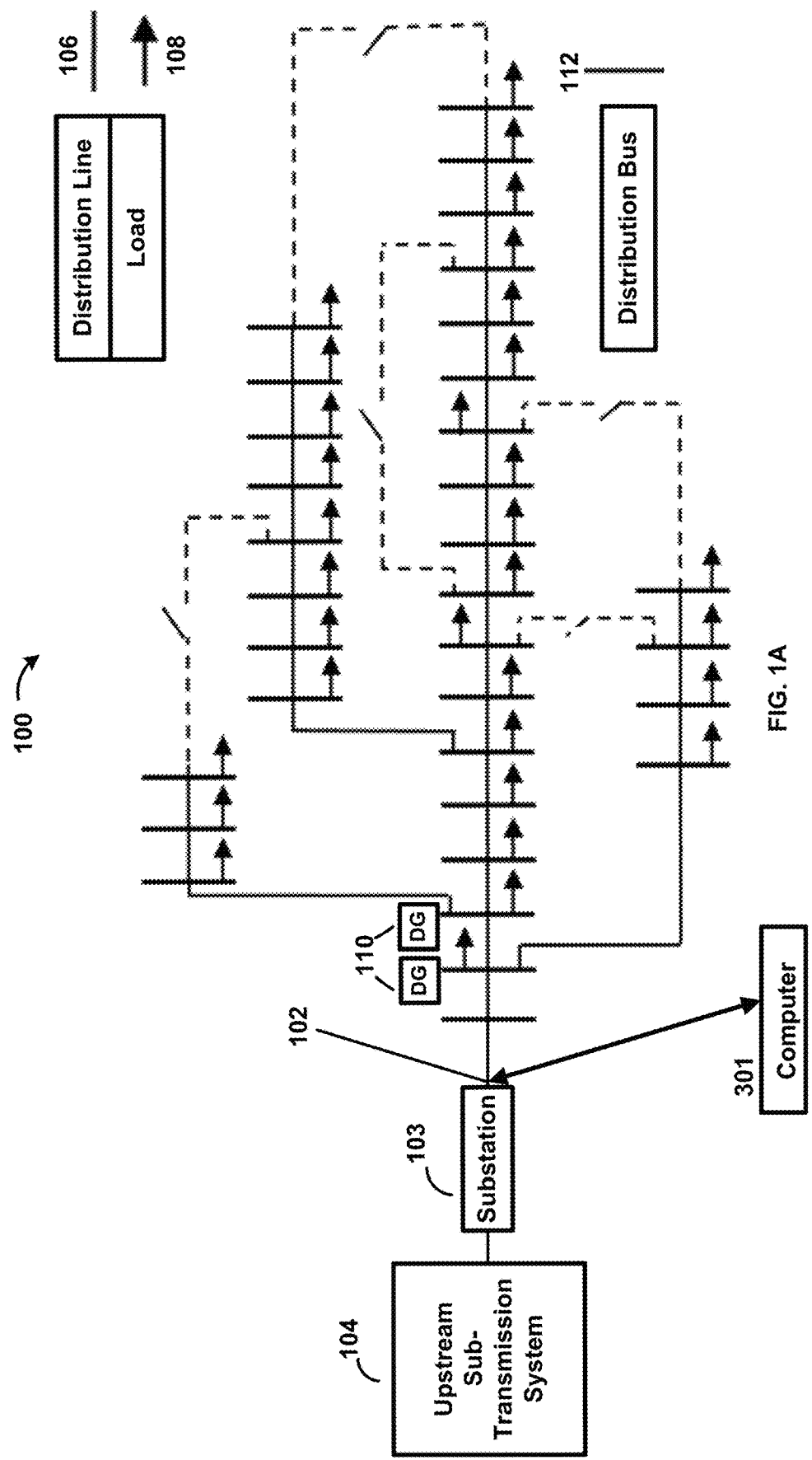
FIG. 1A depicts an exemplary distribution network.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods. The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

The present methods and systems can be used for, among other things, determining linear active and reactive power flows in a distribution line of a distribution network. As will be discussed in further detail below, the present methods and systems improve upon existing methods in terms of computational resource requirements without sacrificing speed or accuracy. The existing methods can be classified into two main groups: those that are linear-based and those that are nonlinear-based. Nonlinear methods are based on Kirchhoff's Voltage Law ("KVL") and Kirchhoff's Current Law ("KCL"). In addition, most of the nonlinear methods model electrical loads using constant active and reactive power withdrawals, which are common among electric utilities. In contrast, the linear methods primarily focus on changing the load model such that the traditional KVL and KCL equations used in a power flow analysis can be solved directly. Some of the existing linear methods use approximations in order to make the load model simpler, such as curve-fitting on the model. Other existing linear methods consider ZIP models (e.g., impedance, current, and power) of the loads.

It is to be understood that the term "electric load" (or simply "load") used herein represents the aggregation of hundreds, or even thousands, of individual component devices such as motors, lighting equipment, and electrical appliances that are part of, or connected to, a distribution network. To model the complex behavior of these aggregated loads, various models have been developed, such as an exponential or polynomial model, a ZIP model, and a constant real/reactive model. Some of the existing models result in nonlinear power flow equations. For example, the backward/forward sweep method consists of two main steps: (1) forward sweep and (2) backward sweep. Initially, voltage level of all distribution buses is assumed to be 1 pu and current supplied on each load bus is determined. In the forward sweep, a voltage drop on each branch is calculated from the end point of each feeder far back to the beginning of the feeder or lateral. In the backward sweep, new distribution bus voltages are used to update the current flow in the feeders from the beginning of each feeder far to the end of the feeder. This process is repeated until the bus voltage variation is smaller than a specific tolerance which ensures the solution converges. While the backward/forward sweep method is one of the most widely used power flow modeling methods for distribution networks, it is quite time-consuming.

The present methods and systems are based in part on an active/reactive load model, hence removing the need for conversion to ZIP models. The linear power flow determined by the present methods and systems is in line with practical applications in distribution companies, and it can be made applicable to radial distribution networks. Further, the present methods and systems can be used to determine a set of sensitivity factors (e.g., representing relationships between distribution bus voltage magnitudes and nodal injections) and to derive equations that can be used for direct calculation of node voltage magnitudes and active and reactive power flows in distribution lines. Additionally, the linear power flow determined by the present methods and systems takes into account specific characteristics of a distribution network, such as, for example, high R/X ratios. The present methods and systems therefore have extensive applications in modern power systems. For example, they can be used in hosting capacity calculations (e.g., considering the impact of nodal injections on system performance), distributed generation placement (e.g., considering the impact of varying levels and locations of power generation on system characteristics), volt/VAR control and optimization (e.g., considering the impact of nodal injections on system reactive power requirements), and electricity pricing (e.g., under a distribution market environment), to name a few. Moreover, the present methods and systems require only minor approximations to be made, which leads to a more accurate result, and the linear nature of the determined network power flow means processing times are shorter and computational burdens are lessened.

Turning now to FIG. 1A, an example distribution network 100 with which the methods and systems described herein may be implemented is depicted. The distribution network 100 may be arranged in a tree-type configuration with a substation 103 at the top of the tree providing electrical power through one or more distribution lines 106 connected to one more one distribution buses 112, each of which having a given electrical load 108. The one or more distribution lines 106 may be connected to any number of the one or more distribution buses 112 using a variety of suitable configurations known in the art. The one or more distribution buses 112 may have a range of designs, including, for example, being housed within switchgear, panel boards, and/or busway enclosures all of which being capable of withstanding a variety of electrical loads 108. The one or more distribution buses 112 may be connected to high voltage equipment at electrical switchyards, low voltage equipment in battery banks, residential transformers, or the like. The distribution network 100 may also comprise one or more distributed generators 110, each of which being situated at a given distribution bus 112 and being capable of providing electrical power through distribution lines 106. The one or more distributed generators 110 may be one or more solar photovoltaic ("PV") devices, one or more wind turbines, or the like, located at commercial locations and/or residential locations.

The substation 103 may be connected by distribution lines 106 to an upstream sub-transmission system 104, and connected by distribution lines 106 at a point of interest 102 to distribution network 100. The upstream sub-transmission system 104 may receive excess electrical power from the distribution network 100 via distribution lines 106. In some cases this can occur when a given distributed generator 110 at a given distribution bus 112 is generating more electrical power than what is being consumed at the given distribution bus 112. The upstream sub-transmission system 104 can therefore be considered as an infinite distribution bus 112 with a constant voltage magnitude. The point of interest 102 can be at any of the one more distribution buses 112. It is to be understood that the distribution grid layouts described herein (e.g., distribution network 100) are for illustrative purposes only. Additional distribution grid layouts are contemplated.

Figure 1B:
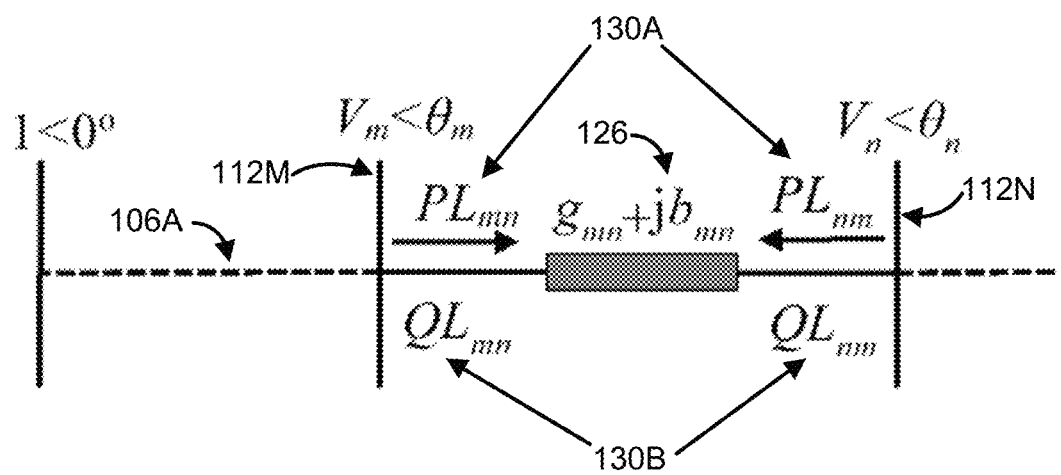
FIG. 1B depicts a schematic diagram of an exemplary distribution line of a distribution network.

FIG. 1B depicts a schematic diagram of a distribution line 106A between two distribution buses 112$m$ and 112$n$ in the distribution network 100. The electrical power flowing in distribution line 106A between the two distribution buses 112$m$ and 112$n$ (referred to herein as "$SL_{mn}$") may be determined using the following equation, where $V_m$ is a voltage magnitude at distribution bus 112$m$, $I_{mn}$ is current flowing from distribution bus 112$m$ to distribution bus 112$n$, and * represents conjugate:

$$SL_{mn} = V_m I^*_{mn}.$$

This equation can also be written based on respective voltage magnitudes and angles at distribution buses 112$m$ and 112$n$ in order to obtain active and reactive power flows in the distribution line 106A, as shown in the equations below where g is the distribution line's 106A conductance, b is the distribution line's 106A susceptance, V is voltage magnitude at either distribution bus 112$m$ or 112$n$, θ is the voltage angle at either distribution bus 112$m$ or 112$n$, PL is the distribution line's 106A active power flow, and QL is the distribution line's 106A reactive power flow:

$$PL_{mn} = g_{mn}V_m^2 - V_mV_n(g_{mn}\cos(\theta_m-\theta_n)+b_{mn}\sin(\theta_m-\theta_n))$$

$$QL_{mn} = -b_{mn}V_m^2 - V_mV_n(-b_{mn}\cos(\theta_m-\theta_n)+g_{mn}\sin(\theta_m-\theta_n))$$

As one skilled in the art can appreciate, the above two equations are highly non-linear as they include multiplication of variables as well as trigonometric terms. In some aspects, when performing a steady state analysis of a distribution network 100, it can be assumed that voltage magnitude and phase angle at the point of interest 102 where the distribution network 100 is connected to the upstream sub-transmission system 104 are both known and fixed. This is a valid assumption because, as noted previously, the upstream sub-transmission system 104 can be considered to be an infinite distribution bus 112 with a constant voltage magnitude. Assuming that voltage at the point of interest 102 is $1\angle 0°$ pu, all downstream distribution bus 112 voltages and phase angles can be represented as deviations from this value. In other words, the voltage magnitude in each distribution bus 112 can be defined as 1.0 pu plus the deviation from the point of interest 102 voltage magnitude, and a voltage phase angle of each distribution bus 112 can be defined as 0° plus the deviation from the point of interest 102 voltage angle. This relationship is represented in the equations below, where $\Delta V_m$ is a voltage magnitude deviation in distribution bus 112$m$; $\Delta\theta_m$ is a voltage phase angle deviation in distribution bus 112$m$; and $\forall m \in B$ indicates that the distribution bus 112$m$ is part of the distribution network 100.

$$V_m = 1 + \Delta V_m \ \forall m \in B$$

$$\theta_m = 0 + \Delta\theta_m \ \forall m \in B$$

Those skilled in the art can appreciate that the above two equations may not add approximations to distribution line flow equations; rather, they can simply redefine $V_m$ and $\theta_m$ using the point of interest 102 as a reference. Any other constant values can be considered for reference voltage magnitude and phase angle at the point of interest 102 without loss of generality. Therefore, two assumptions can be made to simplify the distribution line 106A flow equations. First, a difference in voltage angles of adjacent distribution buses 112$m$ and 112$n$ can be considered to be small, thus trigonometric terms can be approximated shown below:

$$\sin(\theta_m-\theta_n) \approx \theta_m-\theta_n = \Delta\theta_m - \Delta\theta_n \ \forall mn \in L$$

$$\cos(\theta_m-\theta_n) \approx 1 \ \forall mn \in L$$

A second assumption that can be made is that terms including the multiplication of $\Delta V$ and $\Delta\theta$ can be very small and therefore ignored. In other words, it can be assumed that $\Delta V_m\Delta\theta_m = \Delta V_m\Delta\theta_n = \Delta V_n\Delta\theta_m = \Delta V_n\Delta\theta_n \approx 0$. This is a reasonable assumption because both voltage magnitude and phase angle deviations from the point of interest 102 values are likely to be small. Based on this assumption, the real and reactive distribution line 106A flows in the above two equations can be simplified and, by rearranging the terms, reformulated as shown below:

$$PL_{mn} = g_{mn}(\Delta V_m - \Delta V_n) - b_{mn}(\theta_m - \theta_n) + g_{mn}\Delta \hat{V}_m(\Delta V_m - \Delta V_n)$$

$$QL_{mn} = -b_{mn}(\Delta V_m - \Delta V_n) - g_{mn}(\theta_m - \theta_n) - b_{mn}\Delta \hat{V}_m(\Delta V_m - \Delta V_n)$$

The above reformulated equations represent real 130A and reactive 130B distribution line 106A flows, which, rather than being based on actual distribution bus 112m,112n voltage magnitudes and phase angles, are instead based on voltage magnitude and phase angle deviations from the voltage magnitude and phase angle of the point of interest 102. In both of the reformulated equations, the first and second terms may be linear, however, the third terms may be nonlinear. This nonlinearity can be dealt with in two successive steps. First, the nonlinear terms can be simply removed and the resultant equations may be used to determine active (e.g., PL) and reactive (e.g., QL) power flows in the distribution line 106A. In some aspects this can ensure that $PL_{mn} + PL_{nm} = 0$ and $QL_{mn} + QL_{nm} = 0$, thereby potentially making distribution line 106A losses zero hence it can be considered a "lossless power flow." Second, $\Delta V_m$ values obtained from the lossless power flow can be treated as constants in the nonlinear terms in the equations (e.g., $\Delta \hat{V}_m(\Delta V_m - \Delta V_n)$, where $\Delta \hat{V}_m$ represents the already-determined voltage magnitude obtained from the "lossless power flow" model). The nonlinear terms can now be converted into linear terms, which can further ensure that any required approximations will be much smaller than in the "lossless power flow" model. In this example, $PL_{mn} + PL_{nm} \neq 0$ and $QL_{mn} + QL_{nm} \neq 0$, so these equations may consider distribution line 106A losses as well.

The two-step approach discussed above can be extended and applied to a three-phase unbalanced distribution network. Distribution network 100 can be considered to be a three-phase unbalanced distribution network in cases where one or more loads 108 are unbalanced as compared to one or more other loads 108. In such cases, active and reactive distribution line 106 flows can be determined using the equations below, which incorporate mutual conductances and susceptances:

$$PL_{mn}^a = V_m^a V_m^a (g_{mn}^{aa}\cos(\theta_m^a - \theta_m^a) + b_{mn}^{aa}\sin(\theta_m^a - \theta_m^a)) +$$
$$V_m^a V_m^b (g_{mn}^{ab}\cos(\theta_m^a - \theta_m^b) + b_{mn}^{ab}\sin(\theta_m^a - \theta_m^b)) +$$
$$V_m^a V_m^c (g_{mn}^{ac}\cos(\theta_m^a - \theta_m^c) + b_{mn}^{ac}\sin(\theta_m^a - \theta_m^c)) -$$
$$V_m^a V_n^a (g_{mn}^{aa}\cos(\theta_m^a - \theta_n^a) + b_{mn}^{aa}\sin(\theta_m^a - \theta_m^a)) -$$
$$V_m^a V_n^b (g_{mn}^{ab}\cos(\theta_m^a - \theta_n^b) + b_{mn}^{ab}\sin(\theta_m^a - \theta_m^b)) -$$
$$V_m^a V_n^c (g_{mn}^{ac}\cos(\theta_m^a - \theta_n^c) + b_{mn}^{ac}\sin(\theta_m^a - \theta_n^c))$$

$$QL_{mn}^a = V_m^a V_m^a (g_{mn}^{aa}\sin(\theta_m^a - \theta_m^a) - b_{mn}^{aa}\cos(\theta_m^a - \theta_m^a)) -$$
$$V_m^a V_n^a (g_{mn}^{aa}\sin(\theta_m^a - \theta_n^a) - b_{mn}^{aa}\cos(\theta_m^a - \theta_n^a)) +$$
$$V_m^a V_m^b (g_{mn}^{ab}\sin(\theta_m^a - \theta_m^b) - b_{mn}^{ab}\cos(\theta_m^a - \theta_m^b)) -$$
$$V_m^a V_n^b (g_{mn}^{ab}\sin(\theta_m^a - \theta_n^b) - b_{mn}^{ab}\cos(\theta_m^a - \theta_n^b)) +$$
$$V_m^a V_m^c (g_{mn}^{ac}\sin(\theta_m^a - \theta_m^c) - b_{mn}^{ac}\cos(\theta_m^a - \theta_m^c)) -$$
$$V_m^a V_n^c (g_{mn}^{ac}\sin(\theta_m^a - \theta_n^c) - b_{mn}^{ac}\cos(\theta_m^a - \theta_n^c))$$

In implementing the above equations, several assumptions may be made. First, the voltage angle and magnitude at the substation 103 are fixed (e.g., the substation acts as an infinite distribution bus 112). This assumption is detailed in the equations below, where: a represents the first phase, b represents the second phase, and c represents the third phase:

$$V_m^a = 1 + \Delta V_m^a$$

$$V_m^b = 1 + \Delta V_m^b$$

$$V_m^c = 1 + \Delta V_m^c$$

$$\theta_m^a = 0 + \Delta \theta_m^a$$

$$\theta_m^b = 0 + \Delta \theta_m^b$$

$$\theta_m^c = 0 + \Delta \theta_m^c$$

Second, it can be assumed that a difference in voltage angles of adjacent distribution buses 112m and 112n is small (e.g., $\cos(\theta_m^a - \theta_n^a) \approx 1$; $\sin(\theta_m^a - \theta_n^a) \approx (\theta_m^a - \theta_n^a)$). Third, it can be assumed that a difference between voltage angles of two different phases of two distribution buses 112 (e.g., a difference between a voltage angle for phase a of distribution bus 112m and a voltage angle for phase b of distribution bus 112m) can be approximated using a difference of voltage angles for a single phase of the two distribution buses 112 (e.g., a difference between a voltage angle for phase a of distribution bus 112m and a voltage angle for phase a of distribution bus 112n). For example, the difference may be expressed as plus or minus $2\pi/3$, depending on which two phases are being considered. This assumption can be expressed as follows:

$$\cos(\theta_m^a - \theta_m^b) \approx \cos(120) = -0.5 \text{ define } \alpha^{ab} = \cos(120) = -0.5$$

$$\sin(\theta_m^a - \theta_m^b) \approx \sin(120) = 0.86 \text{ define } \beta^{ab} = \sin(120) = 0.86$$

$$\cos(\theta_m^a - \theta_n^b) = \cos(\theta_m^a - \theta_m^b + \theta_m^b - \theta_n^b) \approx \alpha^{ab} * 1 - \beta^{ab}(\theta_m^b - \theta_n^b)$$

$$\sin(\theta_m^a - \theta_n^b) = \sin(\theta_m^a - \theta_m^b + \theta_m^b - \theta_n^b) \approx \beta^{ab} * 1 + \alpha^{ab}(\theta_m^b - \theta_n^b)$$

$$\cos(\theta_m^a - \theta_m^c) \approx \cos(240) = -0.5 \text{ define } \alpha^{ac} = \cos(240) = -0.5$$

$$\sin(\theta_m^a - \theta_m^c) \approx \sin(240) = -0.86 \text{ define } \beta^{ac} = \sin(240) = -0.86$$

$$\cos(\theta_m^a - \theta_n^c) = \cos(\theta_m^a - \theta_m^c + \theta_m^c - \theta_n^c) \approx \alpha^{ac} * 1 - \beta^{ac}(\theta_m^c - \theta_n^c)$$

$$\sin(\theta_m^a - \theta_n^c) = \sin(\theta_m^a - \theta_m^c + \theta_m^c - \theta_n^c) \approx \beta^{ac} * 1 + \alpha^{ac}(\theta_m^c - \theta_n^c)$$

Fourth, it can be assumed that terms including the multiplication of $\Delta V$ and $\Delta \theta$ are very small and can be ignored. In other words, it can be assumed for distribution buses 112m and 112n that $\Delta_m \Delta \theta_m = \Delta V_m \Delta \theta_n = \Delta V_n \Delta \theta_m = \Delta V_n \Delta \theta_n = 0$. Using these assumptions, the following two equations may be used to determine an active power flow and a reactive power flow for phase a of distribution line 106A. Further, the determined active power flow for phase a of distribution line 106A can be implemented into the two-step linearization process discussed above. For example, when considering phase a for distribution bus 112m in the first step, which ignores $\Delta V_m^a$, the active power flow can be expressed as follows:

$$PL_{mn}^a = g_{mn}^{aa}(\Delta V_m^a - \Delta V_n^a) + (-b_{mn}^{aa})(\Delta \theta_m^a - \Delta \theta_n^a) +$$
$$(g_{mn}^{ab}\alpha^{ab} + b_{mn}^{ab}\beta^{ab})(\Delta V_m^b - \Delta V_n^b) + (g_{mn}^{ab}\beta^{ab} - b_{mn}^{ab}\alpha^{ab})(\Delta \theta_m^b - \Delta \theta_n^b) +$$
$$(g_{mn}^{ac}\alpha^{ac} + b_{mn}^{ac}\beta^{ac})(\Delta V_m^c - \Delta V_n^c) + (g_{mn}^{ac}\beta^{ac} - b_{mn}^{ac}\alpha^{ac})(\Delta \theta_m^c - \Delta \theta_n^c)$$

Continuing with the same example, for the second step, where the determined $\Delta V_m^a$ is considered, the active power flow can be expressed as follows:

$$PL_{mn}^a = g_{mn}^{aa}(1 + \Delta \hat{V}_m^a)(\Delta V_m^a - \Delta V_n^a) +$$
$$(-b_{mn}^{aa})(\Delta \theta_m^a - \Delta \theta_n^a) + (g_{mn}^{ab}\alpha^{ab} + b_{mn}^{ab}\beta^{ab})(1 + \Delta \hat{V}_m^a)(\Delta V_m^b - \Delta V_n^b) +$$
$$(g_{mn}^{ab}\beta^{ab} - b_{mn}^{ab}\alpha^{ab})(\Delta \theta_m^b - \Delta \theta_n^b) + (g_{mn}^{ac}\alpha^{ac} + b_{mn}^{ac}\beta^{ac})$$
$$(1 + \Delta \hat{V}_m^a)(\Delta V_m^c - \Delta V_n^c) + (g_{mn}^{ac}\beta^{ac} - b_{mn}^{ac}\alpha^{ac})(\Delta \theta_m^c - \Delta \theta_n^c)$$

The reactive power flow may be expressed in a similar manner. For example, for the first step, which ignores $\Delta V_m^a$, the reactive power flow can be expressed as follows:

$$QL_{mn}^a = -b_{mn}^{aa}(\Delta V_m^a - \Delta V_n^a) + (-g_{mn}^{aa})(\Delta \theta_m^a - \Delta \theta_n^a) +$$
$$(g_{mn}^{ab}\beta^{ab} - b_{mn}^{ab}\alpha^{ab})(\Delta V_m^b - \Delta V_n^b) + (-g_{mn}^{ab}\alpha^{ab} - b_{mn}^{ab}\beta^{ab})(\Delta \theta_m^b - \Delta \theta_n^b) +$$
$$(g_{mn}^{ac}\beta^{ac} - b_{mn}^{ac}\alpha^{ac})(\Delta V_m^c - \Delta V_n^c) + (-g_{mn}^{ac}\alpha^{ac} - b_{mn}^{ac}\beta^{ac})(\Delta \theta_m^c - \Delta \theta_n^c)$$

For the second step, where the determined $\Delta V_m^a$, is considered, the reactive power flow can be expressed as follows:

$$QL_{mn}^a = -b_{mn}^{aa}(1 + \Delta \hat{V}_m^a)(\Delta V_m^a - \Delta V_n^a) +$$
$$(-g_{mn}^{aa})(\Delta \theta_m^a - \Delta \theta_n^a) + (g_{mn}^{ab}\beta^{ab} - b_{mn}^{ab}\alpha^{ab})(1 + \Delta \hat{V}_m^a)(\Delta V_m^b - \Delta V_n^b) +$$
$$(-g_{mn}^{ab}\alpha^{ab} - b_{mn}^{ab}\beta^{ab})(\Delta \theta_m^b - \Delta \theta_n^b) +$$
$$(g_{mn}^{ac}\beta^{ac} - b_{mn}^{ac}\alpha^{ac})(1 + \Delta \hat{V}_m^a)(\Delta V_m^c - \Delta V_n^c) +$$
$$(-g_{mn}^{ac}\alpha^{ac} - b_{mn}^{ac}\beta^{ac})(\Delta \theta_m^c - \Delta \theta_n^c)$$

While the above examples only considered phase a, one of skill in the art can appreciate that an active and reactive power flow can be determined for phases b and c using the same methodology (e.g., with updated indices).

Once the active and reactive power flows for the distribution line 106A are determined, a power flow for the entire distribution network 100 (e.g., a "network power flow") can be generated. The network power flow may account for nodal power balance constraints (e.g., constraints for one or more distribution buses 112), and it may be based on nodal injections (e.g., from one or more distributed generators 110 situated at one or more distribution buses 112) and respective voltage magnitudes and angles at each distribution bus 112. The network power flow can be represented as a network power flow matrix, as depicted below:

$$\begin{bmatrix} P \\ Q \end{bmatrix} = \begin{bmatrix} G(I + D\Delta V^{(k-1)}) & -B \\ -B(I + D\Delta V^{(k-1)}) & -G \end{bmatrix} \cdot \begin{bmatrix} \Delta V^{(k)} \\ \Delta \theta^{(k)} \end{bmatrix}$$

G and B represent conductance and susceptance matrices, respectively, in which $G_{mn} = -g_{mn}$, $G_{mn} = \Sigma_n g_{mn}$, $B_{mn} = -b_{mn}$, and $B_{mn} = \Sigma_n b_{mn}$. I represents an identity matrix for the network power flow matrix, having a size of N×N (e.g., N equals a number of distribution buses 112 in the distribution network 100). D represents an operator to convert vector $\Delta V$ into a diagonal matrix. Superscript k denotes the step number (e.g., for step 1, k=1; for step 2, k=2). In the second step, the $\Delta V$ values from the first step may be used to update the network power flow matrix. In the first step (e.g., k=1), it may be assumed that $\Delta V^{(0)} = 0$, which represents an initial starting value. Also in the first step, assuming starting voltage magnitudes are equal to zero, then voltage magnitudes on the right-hand side of the network power flow matrix may be expressed as follows:

$$\Delta V^{(1)} = (B^{-1}G + G^{-1}B)^{-1}(B^{-1}P - G^{-1}Q)$$

The above equation represents voltage magnitude under a lossless assumption. The voltage magnitudes from the above equation can be plugged into the network power flow matrix to find voltage magnitudes for the second step:

$$\Delta V^{(2)} = ((B^{-1} + G + G^{-1}B) + D(B^{-1}P - Q))^{-1} \cdot (B^{-1}P - G^{-1}Q)$$

The above equation can be used to directly determine voltage magnitudes at any distribution bus 112 in the distribution network 100 without the need to solve the active and reactive power flow equations for each distribution line 106 between any two distribution buses 112 (e.g., for any set of distribution buses 112m and 112n). Moreover, if there are any changes in nodal injections (e.g., more or less power generated by a distributed generator 110 at a given distribution bus 112), then the above equation can be used to quickly find new voltage magnitudes taking the changes into account.

Figure 2A:
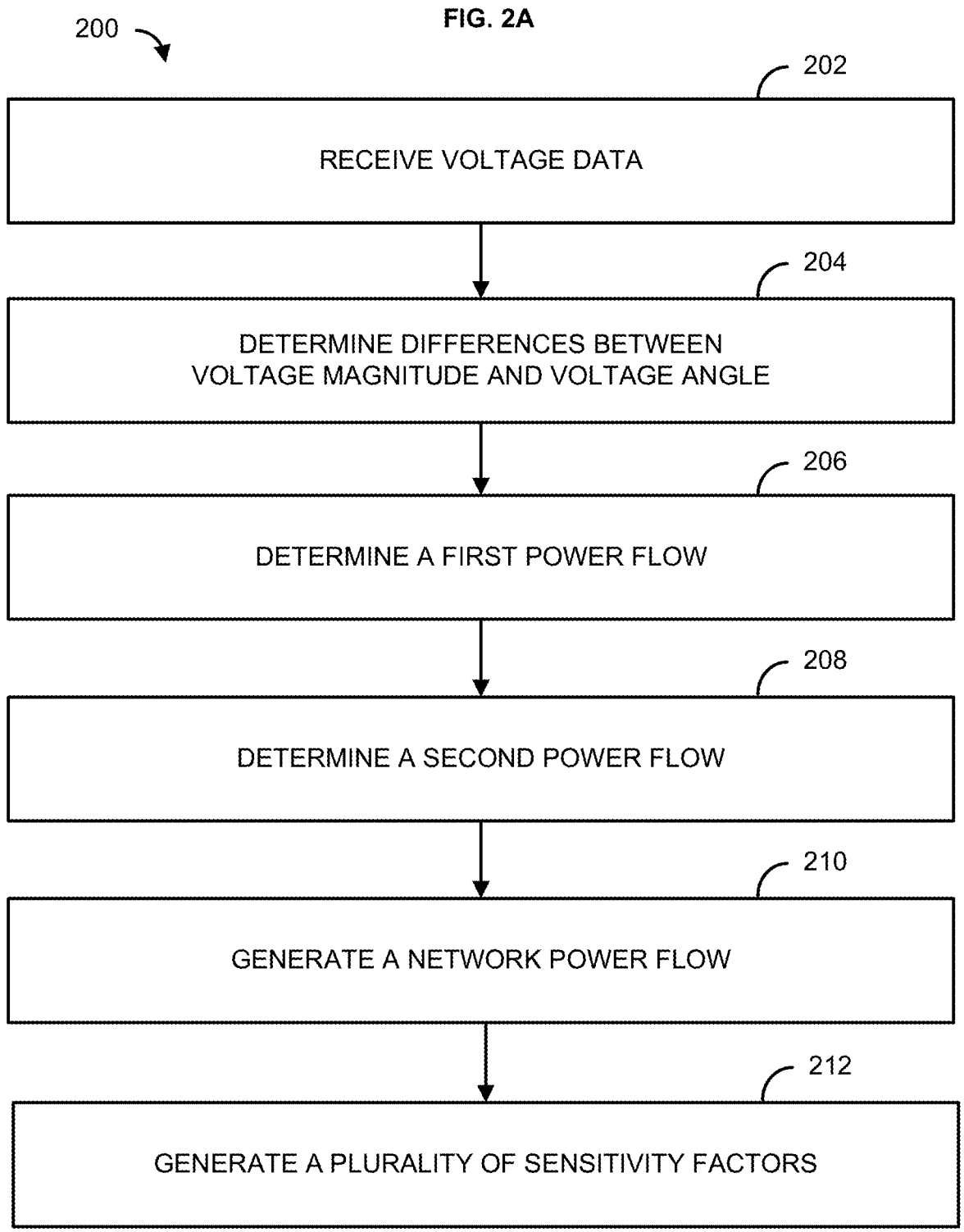
FIG. 2A is a flowchart illustrating an exemplary method.

Turning now to FIG. 2A, a flowchart of an exemplary method 200 implementing the processes discussed above is depicted. At step 202, voltage data is received, which represents respective voltage magnitudes and voltage angles for a point of interest ("POI"), a first bus (e.g., distribution bus 112m), and a second bus (e.g., distribution bus 112n) in a distribution network (e.g., distribution network 100). The distribution network can be arranged in a tree-type configuration with a substation (e.g., substation 103) at the top of the tree providing electrical power through one or more distribution lines (e.g., distribution lines 106) connected to one more one distribution buses (e.g., distribution buses 112m and 112n), each of which having a given electrical load (e.g., electrical load 108). In some examples, the distribution network may be a three-phase unbalanced distribution network, and a given electrical load may be unbalanced. In further examples, the distribution network has at least three distribution buses. In such examples, the voltage data further represents a voltage magnitude and a voltage angle for a third distribution bus. Distributed generators (e.g., distributed generators 110) may be situated at one or more of the distribution buses. Further, the substation may be connected by the distribution lines to an upstream sub-transmission system (e.g., upstream sub-transmission system 104), and the substation may be considered the POI.

At step 204, using the voltage data, a difference between the voltage magnitude and the voltage angle at the POI and the voltage magnitude and the voltage angle at the first distribution bus can be determined. Additionally, a difference between the voltage magnitude and the voltage angle at the POI and the voltage magnitude and the voltage angle at the second distribution bus can be determined as well. Also, in examples where the distribution network has at least three buses, a difference between the voltage magnitude and the voltage angle at the POI and the voltage magnitude and the voltage angle at the third distribution bus can be determined. The same determination can be made for as many distribution buses that are within the distribution network.

Next, at step 206, using the determined differences between the voltage magnitude and the voltage angle at the POI and the respective voltage magnitudes and voltage angles at the first and second distribution buses, a first power flow for a distribution line (e.g., distribution line 106A) between the first and second bus can be determined. For example, the first power flow may be an active or a reactive power flow. When determining the first power flow, it may be assumed that differences between the voltage magnitude at the POI and the respective voltage magnitudes at the first and second distribution bus are both zero. At step 208, a second power flow for the distribution line (e.g., distribution line 106A) between the first and second bus can be determined. As with the first power flow, the second power flow may be an active or a reactive power flow. At step 210, using the first and second power flows, a network power flow for the distribution network can be generated. The network power flow may be linear in nature. Additionally, at step 212, a plurality of sensitivity factors associated with each distribution bus can be generated based on the network power flow. The plurality of sensitivity factors may include a relationship between a voltage magnitude at a given distribution bus and nodal injections (e.g., from a distributed generator 110) at the given distribution bus. The plurality of sensitivity factors, along with the network power flow, may be used to determine a voltage magnitude for any distribution bus in the distribution network. Further, in examples where the distribution network has at least three buses, the aforementioned steps of method 200 may further consider the voltage magnitudes and the voltage angles at three, greater than three, or all distribution buses in the distribution network.

Method 200 may, in some examples, include additional steps. For example, based on the network power flow, a hosting capacity for the distribution network can be generated. The hosting capacity may indicate how many distributed generators the distribution network can support without adversely affecting one or more of the plurality of sensitivity factors.

Figure 2B:
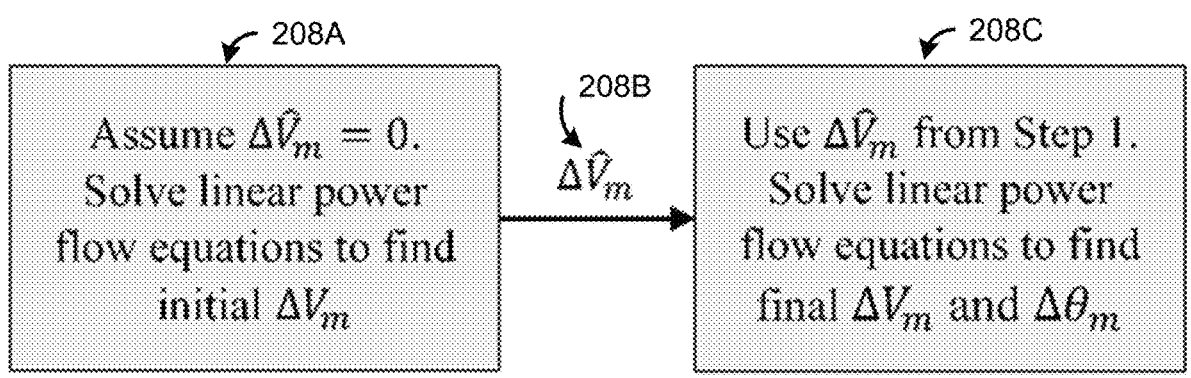
FIG. 2B is a flowchart illustrating an exemplary method.

The hosting capacity may be determined, as depicted in FIG. 2B, by the two-step process described above. This can be referred to as a "lossless hosting capacity model." At step 280A the lossless hosting capacity model can be determined by assuming that $\Delta \dot{V}_m = 0$ when finding an initial $\Delta V_m$. At step 208C, $\Delta \dot{V}_m$ 208B is plugged into the linear power flow equations in order to determine final values for $\Delta V_m$ and $\Delta \theta_m$.

Based on the network power flow, one or more optimal locations within the distribution network for placement of distributed generators can be determined. For example, the one or more optimal locations may be at certain distribution buses in the distribution network where the hosting capacity can optimally be achieved. Additionally, a plurality of reactive power requirements for the distribution network can be received at this step and, based on the network power flow and the plurality of reactive power requirements, one or more reactive power injection locations within the distribution network can be determined. A plurality of input variables associated with the distribution network can be received. Input variables may include costs associated with power generation at a power plant from which the distribution network receives electrical power (e.g., the upstream sub-transmission system 104). Further, based on the network power flow and the plurality of input variables, a cost for distributing a unit of power (e.g., a kilowatt hour) by the distribution network to one or more nodes at one or more distribution buses can be determined.

FIG. 3 is a table 300 of results comparing the performance of the present methods and systems (labeled "Proposed" in FIG. 3) against the commonly used backward/forward sweep method (labeled "Sweep" in FIG. 3) for a set of selected metrics. As the table 300 indicates, the present methods and systems can directly determine voltage magnitudes with less than a 0.11% error as compared to the backward/forward sweep method. Additionally, the present methods and systems can determine active and reactive distribution line flows with less than a 2% error. The considerably small value of the mean absolute percentage errors (labeled "MAPE" in FIG. 3), which takes into account all distribution buses and distribution lines, further indicates the robust performance and accuracy of the present methods and systems.

Those skilled in the art may recognize that the $\Delta V_m$ value from the distribution line flow equations may be calculated again and plugged back into the distribution line flow equations thereby possibly achieving even more accurate results; however, the amount of change in the determined voltage magnitudes, distribution line flows, and overall network loss after the second step is minimal. This is true even for worst-case voltage magnitude and distribution line flow values. FIG. 4 shows at table 400 that compares the results from using only the two-step process described above with results from adding a third and a fourth step. Further, the results in FIG. 4 were derived from tests which accounted for worst-case values (e.g., various unbalanced electrical loads at two or more distribution buses). In other words, the results in FIG. 4 indicate that plugging the $\Delta V_m$ value determined in step two back into the distribution line flow equations a third time (Step 3 in FIG. 4) or even a fourth time (Step 4 in FIG. 4) does not increase the accuracy of the results in any significant way. Therefore, the present methods and systems can provide accurate results in only two steps rather than requiring additional steps. As a result, the present methods and systems are more computationally efficient (e.g., faster processing time and less resource-intensive) than previous methods described above.

Figure 5:
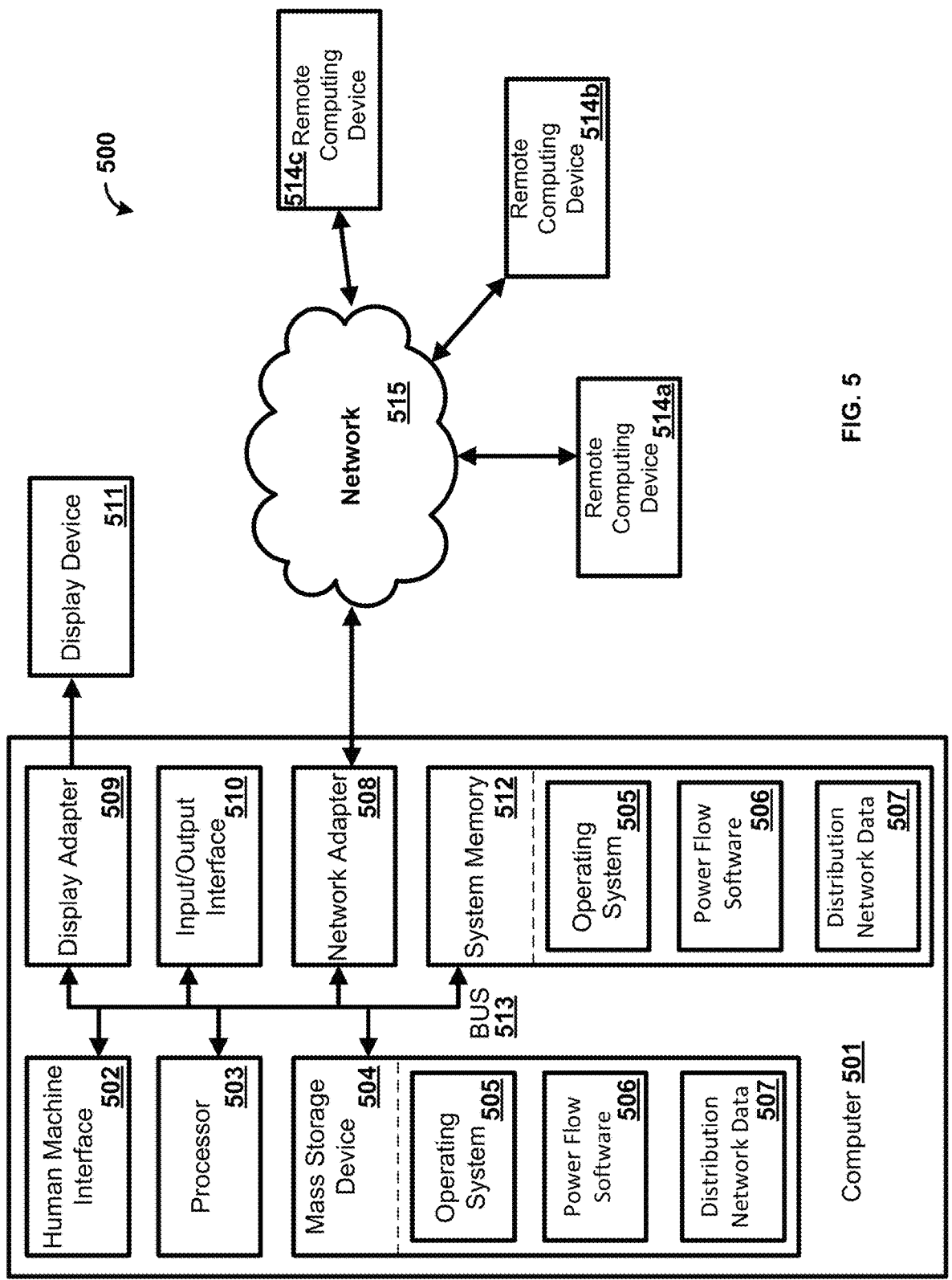
FIG. 5 is a block diagram of an exemplary computing device.

In an exemplary embodiment, the present methods and systems can be implemented on a computer 501 as illustrated in FIG. 5 and described below. Similarly, the present methods and systems can utilize one or more computers to perform one or more functions in one or more locations. FIG. 5 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The computer 501 can be operational with numerous general purpose or special purpose computing system environments or configurations. Examples of well-known computing systems, environments, and/or configurations that can be suitable for use with computer 501 can be, but are not limited to, personal computers, server computers, laptop devices, and/or multiprocessor systems. Additional examples are network PCs, minicomputers, mainframe computers, distributed computing environments that comprise any of the above systems or devices, and the like.

Computer 501 can use software components, including, for example, IBM's CPLEX®, when implementing the present methods and systems. Further, the present methods and systems can be described in the general context of computer-executable instructions, such as program modules, being executed by one or more computers or other devices. Generally, program modules comprise computer code, routines, programs, objects, components, data structures, etc., that perform particular tasks or implement particular abstract data types. The methods and systems can also be practiced in distributed computing environments where tasks are performed by remote processing devices that are linked through a communications network. In a distributed computing environment, program modules can be located in both local and remote computer storage media including memory storage devices.

The components of the computer 501 can include, but are not limited to, one or more processors 503, a system memory 512, and a bus 513 that couples various system components including the one or more processors 503 to the system memory 512. The system can utilize parallel computing. The bus 513 represents one or more of several possible types of bus structures, including a memory bus or memory controller, a peripheral bus, an accelerated graphics port, or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Distribution bus (USB) and the like. The bus 513, and all buses specified in this description, can also be implemented over a wired or wireless network connection and each of the subsystems, including the one or more processors 503, a mass storage device 504, an operating system 505, power flow software 506, distribution network data 507, a network adapter 508, the system memory 512, an Input/Output Interface 510, a display adapter 509, a display device 511, and a human machine interface 502, can be contained within one or more remote computing devices 514a,b,c at physically separate locations, connected through buses 112 of this form, in effect implementing a fully distributed system.

The computer 501 typically has a variety of computer readable media. Exemplary readable media can be any available media that is accessible by the computer 501 and comprises, for example and not meant to be limiting, both volatile and non-volatile media, removable and non-removable media. The system memory 512 comprises computer readable media in the form of volatile memory, such as random access memory (RAM), and/or non-volatile memory, such as read only memory (ROM). The system memory 512 typically contains data such as the distribution network data 507 and/or program modules such as the operating system 505 and the power flow software 506 that are immediately accessible to and/or are presently operated on by the one or more processors 503.

In another aspect, the computer 501 can also comprise other removable/non-removable, volatile/non-volatile computer storage media. By way of example, FIG. 5 illustrates the mass storage device 504 which can provide non-volatile storage of computer code, computer readable instructions, data structures, program modules, and other data for the computer 501. For example and not meant to be limiting, the mass storage device 504 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 504, including by way of example, the operating system 505 and the power flow software 506. Each of the operating system 505 and the power flow software 506 (or some combination thereof) can comprise elements of the programming and the power flow software 506. The distribution network data 507 can also be stored on the mass storage device 504. The distribution network data 507 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 501 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the one or more processors 503 via the human machine interface 502 that is coupled to the bus 513, but can be connected by other interface and distribution bus structures, such as a parallel port, game port, an IEEE 1394 Port (also known as a Firewire port), a serial port, or a universal serial bus (USB).

In yet another aspect, the display device 511 can also be connected to the bus 513 via an interface, such as the display adapter 509. It is contemplated that the computer 501 can have more than one display adapter 509 and the computer 501 can have more than one display device 511. For example, a display device can be a monitor, an LCD (Liquid Crystal Display), or a projector. In addition to the display device 511, other output peripheral devices can comprise components such as speakers (not shown) and a printer (not shown) which can be connected to the computer 501 via the Input/Output Interface 510. Any step and/or result of the present methods (e.g., method 200 and/or method 250) can be output in any form to an output device. Such output can be any form of visual representation, including, but not limited to, textual, graphical, animation, audio, tactile, and the like. The display 511 and computer 501 can be part of one device, or separate devices.

The computer 501 can operate in a networked environment using logical connections to one or more remote computing devices 514a,b,c. By way of example, a remote computing device can be a personal computer, portable computer, a server, a router, a network computer, a peer device or other common network node, and so on. Logical connections between the computer 501 and a remote computing device 514a,b,c can be made via a network 515, such as a local area network (LAN) and/or a general wide area network (WAN). Such network connections can be through the network adapter 508. The network adapter 508 can be implemented in both wired and wireless environments.

For purposes of illustration, application programs and other executable program components such as the operating system 505 are illustrated herein as discrete blocks, although it is recognized that such programs and components reside at various times in different storage components of the computing device 501, and are executed by the one or more processors 503 of the computer. An implementation of the power flow software 506 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media."

In an aspect, the computing device 501, executing the power flow software 506, can be configured to receive voltage data representing respective voltage magnitudes and voltage angles for a point of interest ("POI"), a first bus (e.g., distribution bus 112$m$), and a second bus (e.g., distribution bus 112$n$) in a distribution network (e.g., distribution network 100) from the system memory 512, mass storage device 504, or network 515. Using the processor 503 and the voltage data, the power flow software 506 can determine a difference between the voltage magnitude and the voltage angle at the POI and the voltage magnitude and the voltage angle at the first distribution bus. The determined difference can then be stored in system memory 512 or mass storage device 504, or, optionally, to network 515. Further, using the processor 503 and the determined difference, a first power flow for a distribution line (e.g., distribution line 106A) between the first and second bus can be determined and stored in system memory 512, mass storage device 504, and/or to network 515. Additionally, using the processor 503 as well as the determined difference and the first power flow, a second power flow for the distribution line (e.g., distribution line 106A) can be determined and stored in system memory 512, mass storage device 504, and/or to network 515. Both the first power flow and the second power flow may either be an active or a reactive power flow. Further, the power flow software 506, using the first and second power flows, can then be used to generate a network power flow for the distribution network and stored in system memory 512, mass storage device 504, and/or to network 515. The network power flow may be linear in nature. Additionally, the power flow software 506 can generate, based on the network power flow, a plurality of sensitivity factors associated with each distribution bus, which are then stored in system memory 512, mass storage device 504, and/or to network 515. The plurality of sensitivity factors may include a relationship between a voltage magnitude at a given distribution bus and nodal injections (e.g., from a distributed generator 110) at the given distribution bus. Finally, the power flow software 506 can use the plurality of sensitivity factors and the network power flow to determine a voltage magnitude for any particular distribution bus and store it in system memory 512, mass storage device 504, and/or to network 515.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

While the disclosed methods and systems have been described in connection with preferred embodiments and specific examples, it is not intended that the scope be limited to the particular embodiments set forth, as the embodiments herein are intended in all respects to be illustrative rather than restrictive. Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method comprising:
receiving, by a computing device, voltage data indicative of respective voltage magnitudes and voltage angles for a point of interest ("POI"), a first bus, and a second bus in a distribution network;
determining, based on the voltage data, respective differences between the voltage magnitude and the voltage angle at the POI and the voltage magnitude and the voltage angle at the first and second bus;
determining, based on the respective voltage magnitudes and voltage angles at the first and second bus, a first power flow for a distribution line between the first and second bus;
determining, based on the first power flow and the respective differences between the POI voltage magnitude and the voltage magnitudes at the first and second bus, a second power flow for the distribution line between the first and second bus;
determining, based on a network power flow, a relationship between a voltage magnitude at each bus in the distribution network and nodal injections at each bus in the distribution network, wherein the network power flow is based on the determined first and second power flows; and
controlling, based on the relationship between the voltage magnitude at each bus and the nodal injections at each bus, the distribution network to perform voltage and reactive power management.

2. The method claim 1, wherein the distribution network comprises at least three buses.

3. The method claim 2, wherein the point of interest is a position in the distribution network at which the distribution network is coupled to an upstream sub-transmission network.

4. The method of claim 1, wherein the distribution network is a radial distribution network.

5. The method of claim 1, wherein the first and second power flows each comprise an active power flow and a reactive power flow on the distribution line between the first and second bus.

6. The method of claim 1, wherein the differences between the POI voltage magnitude and the voltage magnitudes at the first and second bus are assumed to be zero.

7. The method of claim 1 further comprising:
determining, based on the network power flow, a voltage magnitude and a voltage angle for a third bus in the distribution network.

8. A non-transitory computer readable medium comprising processor-executable instructions that, when executed by a processor of a computing device, cause the computing device to:
receive voltage data indicative of respective voltage magnitudes and voltage angles for a point of interest ("POI"), a first bus, and a second bus in a distribution network;
determine, based on the voltage data, respective differences between the voltage magnitude and the voltage angle at the POI and the voltage magnitude and the voltage angle at the first and second bus;
determine, based on the respective voltage magnitudes and voltage angles at the first and second bus, a first power flow for a distribution line between the first and second bus;
determine, based on the first power flow and the respective differences between the POI voltage magnitude and the voltage magnitudes at the first and second bus, a second power flow for the distribution line between the first and second bus;
generate, based on the determined first and second power flows, a network power flow for the distribution network;
determine, based on the network power flow, a relationship between a voltage magnitude at each bus in the distribution network and nodal injections at each bus in the distribution network; and
control, based on the relationship between the voltage magnitude at each bus and the nodal injections at each bus, the distribution network to perform voltage and reactive power management.

9. The non-transitory computer readable medium of claim 8, wherein the distribution network comprises at least three buses.

10. The non-transitory computer readable medium of claim 8, wherein the point of interest is a position in the distribution network at which the distribution network is coupled to an upstream sub-transmission network.

11. The non-transitory computer readable medium of claim 8, wherein the distribution network is a radial distribution network.

12. The non-transitory computer readable medium of claim 8, wherein the first and second power flows each comprise an active power flow and a reactive power flow on the distribution line between the first and second bus.

13. The non-transitory computer readable medium of claim 8, wherein the differences between the POI voltage magnitude and the voltage magnitudes at the first and second bus are assumed to be zero.

14. The non-transitory computer readable medium of claim 8, wherein the processor-executable further cause the computing device to:
determine, based on the network power flow, a voltage magnitude and a voltage angle for a third bus in the distribution network.

15. An apparatus comprising:
one or more processors; and
memory storing processor executable instructions that, when executed by the one or more processors, cause the apparatus to:
receive voltage data indicative of respective voltage magnitudes and voltage angles for a point of interest ("POI"), a first bus, and a second bus in a distribution network;
determine, based on the voltage data, respective differences between the voltage magnitude and the voltage angle at the POI and the voltage magnitude and the voltage angle at the first and second bus;
determine, based on the respective voltage magnitudes and voltage angles at the first and second bus, a first power flow for a distribution line between the first and second bus;
determine, based on the first power flow and the respective differences between the POI voltage magnitude and the voltage magnitudes at the first and second bus, a second power flow for the distribution line between the first and second bus;
generate, based on the determined first and second power flows, a network power flow for the distribution network;
determine, based on the network power flow, a relationship between a voltage magnitude at each bus in the distribution network and nodal injections at each bus in the distribution network; and
control, based on the relationship between the voltage magnitude at each bus and the nodal injections at each bus, the distribution network to perform voltage and reactive power management.

16. The apparatus of claim 15, wherein the distribution network comprises at least three buses.

17. The apparatus of claim 15, wherein the point of interest is a position in the distribution network at which the distribution network is coupled to an upstream sub-transmission network.

18. The apparatus of claim 15, wherein the distribution network is a radial distribution network.

19. The apparatus of claim 15, wherein the first and second power flows each comprise an active power flow and a reactive power flow on the distribution line between the first and second bus.

20. The apparatus of claim 15, wherein the differences between the POI voltage magnitude and the voltage magnitudes at the first and second bus are assumed to be zero.

* * * * *